United States Patent [19]
Bodö et al.

[11] Patent Number: 5,998,875
[45] Date of Patent: *Dec. 7, 1999

[54] FLIP-CHIP TYPE CONNECTION WITH ELASTIC CONTACTS

[75] Inventors: Peter Bodö, Lindköping; Hjalmar Hesselbom, Huddinge; Hans Hentzell, Lindköping, all of Sweden

[73] Assignee: Telefonaktiebolaget LM Ericsson, Stockholm, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 08/994,981

[22] Filed: Dec. 19, 1997

[51] Int. Cl.$^6$ .......................... H01L 23/48; H01L 23/52; H01L 29/40; H01L 23/10
[52] U.S. Cl. .......................... 257/778; 257/688; 257/737; 257/777
[58] Field of Search .................................. 257/737, 777, 257/718, 719, 778, 738, 787, 688, 698, 710

[56] References Cited

U.S. PATENT DOCUMENTS

| | | | |
|---|---|---|---|
| 3,292,240 | 12/1966 | McNutt et al. . | |
| 3,543,106 | 11/1970 | Kern | 257/737 |
| 3,809,625 | 5/1974 | Brown et al. | 257/778 |
| 4,613,891 | 9/1986 | Ng et al. | 257/777 |
| 4,660,066 | 4/1987 | Reid | 257/777 |
| 4,670,770 | 6/1987 | Tai | 257/777 |
| 5,016,138 | 5/1991 | Woodman . | |
| 5,196,371 | 3/1993 | Kulesza et al. . | |
| 5,340,296 | 8/1994 | Schreiber et al. . | |
| 5,381,599 | 1/1995 | Hall | 257/787 |
| 5,393,697 | 2/1995 | Chang et al. . | |
| 5,454,055 | 9/1995 | Kragl et al. . | |
| 5,621,615 | 4/1997 | Dawson et al. | 257/719 |

FOREIGN PATENT DOCUMENTS

| | | |
|---|---|---|
| 0295914 A2 | 12/1988 | European Pat. Off. . |
| 4438053 | 5/1996 | Germany . |
| 61-137208 | 6/1986 | Japan . |
| 63-59476 | 3/1988 | Japan . |
| 2-141167 | 5/1990 | Japan . |

*Primary Examiner*—Mahshid Saadat
*Assistant Examiner*—Jesse A. Fenty
*Attorney, Agent, or Firm*—Burns, Doane, Swecker & Mathis, L.L.P.

[57] ABSTRACT

A mounting structure for a self-aligned flip-chip with elastic contacts. The mounting structure provides non-permanent joints combined with auto-aligning structures, and offers a symmetrical elastic alignment ensuring continued centering of the parts. This is done by using a flip-chip structure 200, which is based on a substrate 202 with an elastomer bump structure 204, molded by using anisotropically etched silicon as a mold. The pattern of elastic bumps 204 on the substrate correspond to a pad pattern 210 on a flip-chip 214. The bumps 204 can be coated with gold, and serve both as electrical contacts 206 and for vertical positioning. A guiding frame 212 of an elastomeric material with inclined frame walls 220 is provided around the bumps and is the same shape as the inclined walls 222 of the flip-chip 214.

27 Claims, 3 Drawing Sheets

FLIP-CHIP TYPE CONNECTION WITH ELASTIC CONTACTS

TECHNICAL FIELD OF THE INVENTION

The present invention relates to a mounting structure for aligning parts in the electric field, more particular to a self-aligned, removable flip-chip type chip connection with elastic contacts.

DESCRIPTION OF RELATED ART

The technical evolution in the field of electronics, has resulted in a demand for faster and more compact systems. In many applications a compact structure combined with a low weight is in itself a requirement. The technical evolution also tends towards more complex systems involving a greater and greater number of components, which need to communicate with each other. In order for the new systems to meet the requirement of quick access between different components, the length of the paths between different components of the system must be kept within certain limits. When the complexity of a system grows, the length of the paths between components also grows. In order not to exceed the maximum allowed distance between such components, these components have been built smaller and smaller and they have also been packed more and more densely. Thus, multi-chip modules have been developed, which makes a very dense packaging of unencapsulated integrated circuits, IC:s, possible.

When mounting IC chips to various substrates several requirements have to be met. These are: improving electrical performance; reliable contacts; mechanical fatigue; dismountable chip assembly; and cooling.

Electrical performance can be improved by replacing wire bonds with solder bumps and possibly micro bumps. A problem using flip-chip technique is that one cannot see and control the alignment when placing the chip, other than through indirect means. This limits the degree of miniaturisation due to alignment problems.

Another problem is to get reliable contacts if the joints are either permanent metal to metal contacts, soldering, permanent pressure contacts using metal bumps or particles in combinations with contracting adhesives.

Another problem is bond wires, which, although they have the ability to fulfil requirements on mechanical fatigue, do not yield optimal frequency performance. For flip-chips, there are only partial solutions. Different solder compositions may yield some elasticity or endurance. Adhesives, filling the remaining space between IC and substrate evens out forces and relieves the strain from the bumps and bump sites on the chip. Also, choosing substrate materials with thermal expansion coefficients close to that of the semiconductor helps substantially, but may prove costly and incompatible to other system requirements. The above scheme for strain reduction makes disassembly especially difficult. Desoldering may prove hazardous to remaining parts of the system.

Conventional chips have been mounted by attaching the chip backside down using eutectic solder, silver epoxy or other adhesives depending on substrate and application. After chip attachment, the electrical connections have been made using wire bonding. From originally being attached only on special carriers or lead frames for single chip encapsulation there has been a development to mount chips in larger assemblies such as Multi Chip Modules MCM/Hybrids and even directly on to boards. Especially for the boards there is a problem with the thermal expansion mis-match between the chip and the board. This has in many cases been acceptably solved by using sufficiently compliant adhesives. As the electrical connections are made by wires, these can handle the thermal movements. The wires also serve the purpose of accomplishing a physical fan-out as the pad pitch on the chip is many times much finer than that available on the substrate especially for boards. It has however also been realised that connecting chips using wires implies an extra inductance, in many cases limiting the effective system performance. Also, for chips with many connections wire bonding can become expensive as it operates on a wire by wire basis.

Thus, alternate chip connection schemes have been developed. One of the directions is to use pre-shaped conduction paths supported by a film and which are simultaneously attached to all the chip pads, so called tape automated bonding, TAB. This does not necessarily improve the inductance, unless a ground plane is included in the film structure.

The other major direction is to use so called flip-chip connections. Here the chip is connected directly to the substrate with the pad side facing the substrate. This is achieved by using bumps of solder or conductive adhesives, which permanently attaches the chip pads to the substrate pads.

Alternately, solid bumps are made using e.g. electrolytic deposition. The chip is then placed on the site where it is to be mounted and either before or after this an organic adhesive is introduced between the chip and the substrate, which has the property of shrinking when curing. Thus the chip and the substrate are pressed towards each other and electrical contact is established between the bumps and the mating pads. This makes the inductance very small, but requires the substrate to have the same resolution as the pad pitch of the chip.

Thermally induced fatigue has been addressed by modifying the solder, which only works to a lesser extent, or by using underfills, i.e. injecting a curable adhesive between the entire chip and the substrate, which distributes the stress of thermal mis-match thereby relieving the bumps part of the strain. There is, however, new strain induced on the chip, which may be harmful.

As a flip-chip does not require the pads to be peripheral to the chip as does wire bonding and in principle TAB, the fan out can be solved by spreading the pads over this area thus being able to place the same amount of pads with much greater spacing. This requires specially made chips. Also, as solder bumps are not very elastic thermal expansion differences between board(/substrate) and the chip results in fatigue of the bonds and/or possible damage to the chip.

Another problem with flip-chip is aligning the chip to the substrate as one does not see the bumps and the mating pads through the opaque chip. In some instances using IR light transparent to the chip material can be used if it is also transparent to the substrate material and if this does not have too many metal lines. The usual procedure is instead to align the chip and the substrate to an alignment and mounting equipment when they are separated and then to perform a very precise predetermined translation. For the solder case, the surface tension of the molten solder bumps can improve alignment, provided that the pre-alignment was within certain limits. For the adhesive cases this is only somewhat possible, depending on the system. Provided the substrate has sufficient resolution, which is mostly the case for present day MCM:s, the limit of the pad resolution is set by the placement precision if solder surface tension is not utilised. Solder is most likely also being phased out due to environmental requirements.

Solder flip-chip has also been reported to yield very high placement precision. This however, does not mean that the bumps could be made very small as there is a relation between surface tension alignment capabilities and solder ball size.

The previous methods have another drawback, which is risky and costly replacement. In many advanced systems it is difficult many times to obtain naked chips that have been fully tested. For e.g. MCM:s that contain 10 IC:s, one obtains only 35% yield of the MCM if the yield of the chips is 90%, which is not at all uncommon for not fully tested chips. At such low yields repair by replacement is an economical necessity. Desoldering or adhesive softening to remove non functioning chips is a risky procedure where both the pads under the removed chip and the surrounding chips or other passive components may be damaged requiring further repair.

In the solid bump scheme where a shrinking adhesive is used to cause mating of the chip bumps to the substrate pads very high degree of flatness and the bump height precision is required to ensure that all contact points mate.

There are existing methods describing self-aligning connections using solid bumps mating pads with grooves. This helps in alignment but as pitches are reduced does not offer coarse pre-alignment as the pre-alignment tolerance is a fraction of the pad size.

Elastic membranes have been used for testing contacting chips. Here the bumps are solid but their support is flexible, thus enabling good contacts even for not perfectly flat chips. By being able to also make impedance controlled transmission lines on these membranes, tests at full speed can be performed.

The U.S. Pat. No. 5,393,697, Shy-Ming Chang et. al., describes a composite bump structure and method for forming the composite bump. The bumps are formed by using material deposition, lithography, and etching technique.

The U.S. Pat. No. 5,196,371, Frank K. Kulesza et. al., describes interconnecting bond pads of a flip-chip with bond pads of a substrate by an electrically conductive polymer.

The JP patent application 2-141 167 A, Noriko Kakimoto, describes spacers that are smaller than the diameter of elastic conductive particles. The spacer's height is set in order to protect the bumps and the elastic conductive particles from application of excessive forces.

The JP patent application 63-59476, Aiichiro Umezuki, describes elastic layers in-between the bump and metal pad to avoid mechanical forces during pressure.

The JP patent application 61-137208, Nobuyoshi Onchi, describes an elastical film, which contains bumps, which is used when pressing chips together. Pressing chips allows electrode chip to be elastically deformed, and the resultant repulsive force allows the electrode pieces to be pressed against the pad parts, to perform an electrical connection.

SUMMARY

One problem this invention solves is alignment of chips during flip-chip assembly. When aligning the chip to the substrate, one does not see the bumps and the mating pads through the opaque chip.

The present invention solves the problem with detachable connections, i.e. non permanent joints, combined with auto-aligning structures. This makes replacement of chips very easy, which means that chips can be replaced several times without incurring damage to its pads, substrate pads, other chips or components. Alignment is obtained simultaneously to the entire chip, both gross and fine.

The present invention also solves the problem with thermal fatigue due to thermal mis-match.

Self alignment of flip-chip connection in combination with elasticity and easy detachability is achieved with this invention. Especially the self-alignment makes replacement a cheap and risk-free operation whereby this method is favourable for use in full testing in real environments.

A self-aligned elastic flip-chip type chip connection solution with gold metallised elastic bumps offers detachable electrical connection. The alignment structures offers high precision auto-alignment allowing for very fine pad pitches and where the overall elasticity allows for thermal mis-match without mechanical fatigue. The chip assembly is dismountable at relatively low cost with minimum risk of damaging the remaining parts of the system. This is particularly important for more complex systems where full individual IC testing at relevant frequencies is only partially possible.

Bumps, as well as the alignment structures are elastic. Symmetrical elastic alignment ensures continued centring of the parts even if they expand differently as described in U.S. patent application Ser. No. 08/995,194, "Bumps in grooves for elastic positioning". The chip backside is pressed upon by a cooling plate, which may have oil, grease or liquid metal, to improve thermal conduction but also to allow for sliding. Unequal expansion of the chip and the plate is possible without incurring stress to either part, the alignment structures will yield symmetrically, and possible vertical expansion will be accommodated by the elastic bumps.

In the present invention there is an alignment feature cast at the same time as the bumps. Depending on the amount of wafer/chip processing performed, extremely high pad resolution is obtainable as chip placement is now obtained by auto-alignment. If only precision sawing is performed, placement accuracy will depend on the precision of the cuts. If special structure etching defined by lithography, i.e. potentially submicron precision, is performed placement could be done at around one micron precision without any special placement equipment.

The chips, used in this invention, are used in their right environment and still easily replaced. This also implies that they can be fully tested in a realistic environment without temporary solid attachments. It could be of great economic consequence as much of the chip carriers as the TAB frames and chip scale packaging used today to a large extent serve the purpose of enabling full testing, not to facilitate or improve properties of chip connection as compared to naked dies.

In the present invention the bumps are on the substrate and are metallised elastic bumps allowing for relaxed requirements on flatness.

One advantage of the present invention is that the electrical contacts are made of elastic bumps, which enables placement and contacting of chips without any soldering or glueing.

Another advantage of the present invention is that the chips are self-aligned during mounting.

A further advantage of the present invention is that the vertical positioning is also self-determined and flexible such that a heat sink can press onto the chip for efficient cooling.

A further advantage of the present invention is that there is no soldering or glueing. Thus, the chip can easily be removed and replaced.

A still further advantage of the present invention is to get good performance: reduced capacitance and inductance of chip connections; good high lateral alignment achievable with the V-groove and V-bumps structure; very fine pitches; and/or very small pads and bumps are possible.

The invention is now being described further with the help of the detailed description of preferred embodiments and attached drawings.

DETAILED DESCRIPTION OF EMBODIMENTS

This invention can be used in various micro-electronic systems, which is used for elastic electrical contacts and built-in chip alignment. It could be used in multi-chip modules, especially where it is hard to determine the quality of chips before they are mounted. The invention would be used, where presently there are several problems with e.g. flip-chip on board due to high mis-match of thermal expansion coefficients between board and chip. Repair can often be risky and expensive, and in some types of MCM, essentially impossible.

Figure 1:
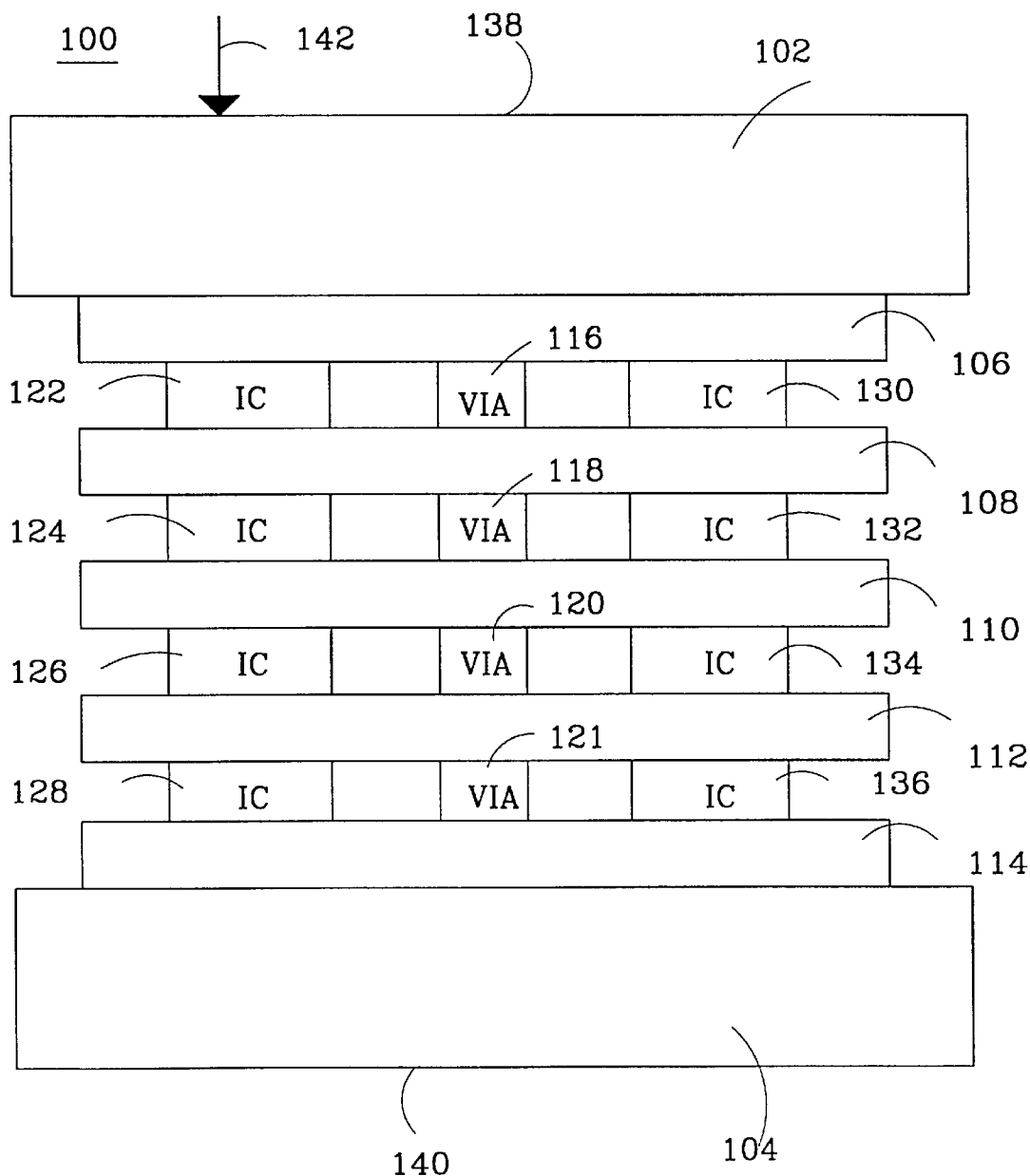
FIG. 1. shows a cross section of a three dimensional multi-chip module.

FIG. 1 shows an example where this invention can be used, but it is not restricted to this area. This invention can of course be used in any kind of micrometer or even sub-micrometer system. FIG. 1 shows a cross section for a three dimensional, 3D, multi-chip module 100. The 3D module is formed by two dimensional, 2D, multi-chip modules consisting of Si or other circuit substrates, e.g. diamond, Ge, GaAs, $Al_2O_3$ or SiC, but is not limited to these materials, having integrated circuit chips 122–136, IC:s, mounted or grown thereon. The Si substrates 106–114 are provided with a grounded plane whereby a good screening is obtained between the different planes of the module as well as for the entire 3D multi-chip module 100. On the substrate 106–114, in particular the ones not located at the top 106 or the bottom 114 of the stack of two dimensional, 2D, multi-chip modules 106–114, there are also mounted passive chips, vias or via chips 116–121 constituting interconnections between adjacent levels of the 3D multi-chip module 100.

The IC chips 122–136 and the via chips 116–121 are in the preferred embodiment flip-chip mounted on the substrates 106–114. This arrangement makes it possible to provide a good contact between the backsides of the flip-chip mounted chips 122–136 and the backside of the adjacent substrates 106–114.

Each level of the IC 122–136 and each individual chip 116–121 of the 3D module 100 is only kept together by a compressing force 142 applied on top plane 138 of the top cooler 102 and the bottom plane 140 of the bottom cooler 104 of the structure.

In order to accomplish this piled structure, elastic bumps are provided, which connect via chips 116–121 and the IC 122–136 to adjacent substrate 106–114, and contact is obtained by pressing the module together at the top plane 138 and the bottom plane 140 of the cooler 102, 104. The compressing force 142 is provided by means of clamps applied to the outermost part of the module 100.

Figure 2:
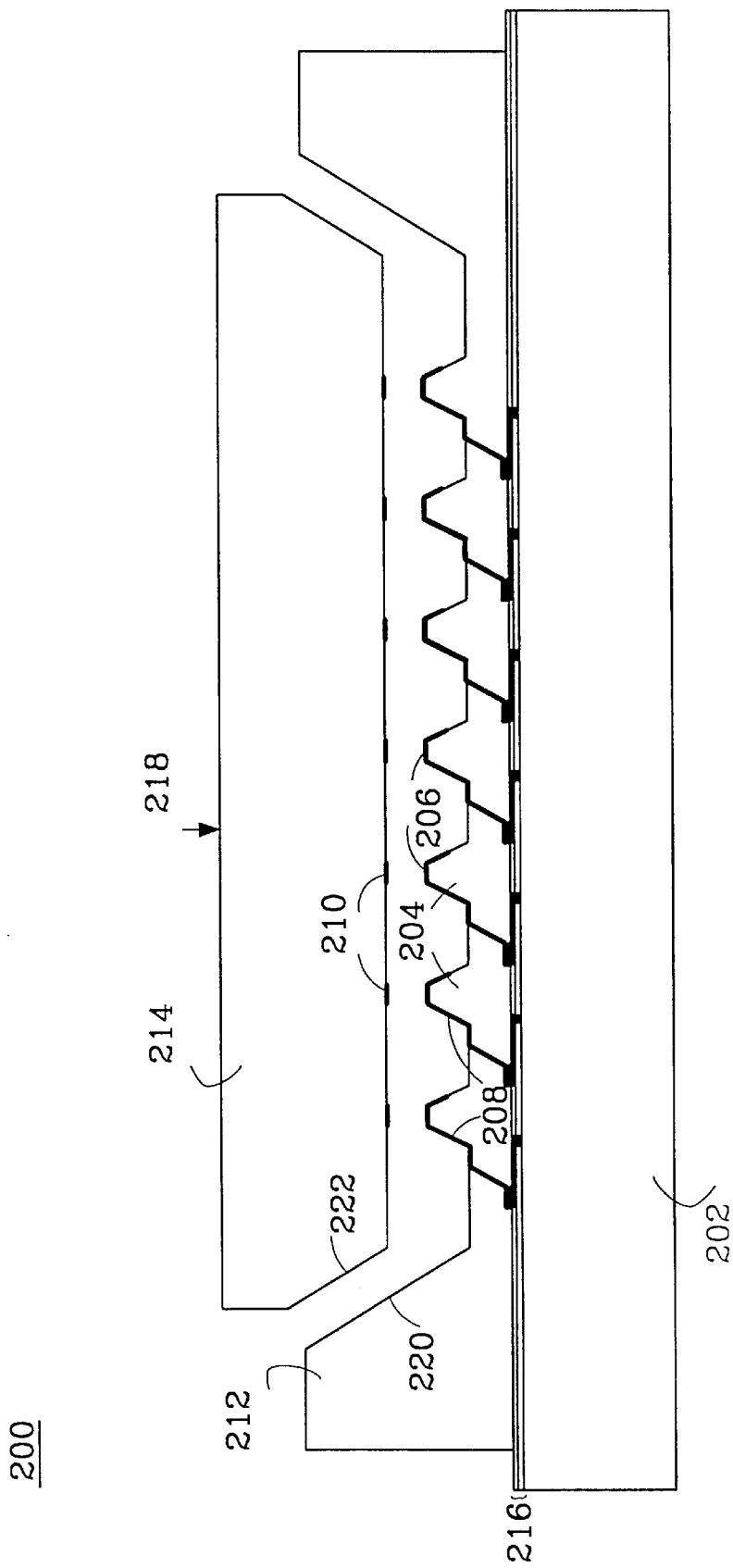
FIG. 2 shows a flip-chip structure with elastic electrical contacts and built-in chip alignment.

In FIG. 2 a flip-chip structure 200 may be a part of FIG. 1, as well as serving as a general IC connection socket. The flip-chip structure 200 is based on a substrate 202 with a elastomer bump structure 204, moulded by using anisotropically etched silicon as a mould. The bump may be of truncated 5 corner pentahedron or truncated pyramidical form. Electrical contact pads 206 and paths 208 are preferably of gold to achieve good electrical contact and reliable mechanical properties of the bumps 204. Other material than gold could be used such as any material with sufficiently large freedom from oxidation, ductility or any other material having the same properties.

The pattern of elastic bumps 204 on the substrate correspond to the pad pattern 210 on the actual chip 214. The bumps 204 can be coated with gold, and serve both as electrical contacts 206 and for vertical positioning. Around the bumps 204 there is a guiding frame 212 of an elastomeric material with inclined frame walls 220 the same shape as the inclined flip-chip walls 222 of the flip-chip 214 to be used for lateral alignment as indicated in FIG. 2.

Usually, the accuracy in dimensions of the chip 214 is limited by the process of cutting wafers into dice. Making V-grooves around each die in the wafer before cutting, the dimensions of its edges will be well defined. If the corresponding guiding frame 212, of some elastic material, is moulded by using anisotropically etched silicon as a mould then the alignment will be very accurate. In this configuration the flip-chip 214 needs to be pressed down and kept in place by some external force 218 from a mechanical arrangement, not shown in this figure. This is to be exerted by, for example, the top cooler 102, see FIG. 1, preferably in floating contact with the backside of the flip-chip 214. This top cooler 102 can be firmly mounted to the substrate 202 as any thermal mis-match will be dealt with by the elasticity of the bumps 204 as well as the guiding frame 212. If desired, the dimensions of the guiding frame 212 can be chosen such that it limits or reduces the vertical deformation of the bumps 204 as the flip-chip 214 is forced against the substrate 202.

By using photolithographic masking, aligned to the already existing structure on the chip 214 before it has been separated, grooves are made in the cutting areas either using anisotropic etching or other techniques. Similar V-grooves as well as the grooves for bumps 204 are also made in similar or dissimilar material that is used as a mould. Either this mould or the part onto which the elastic bumps 204 will be attached is then covered with the elastic material in its pre-cured form, then the part and the mould are pressed together in a vacuum. Hereby the elastic material fills the grooves in the mould. After this the elastic material is cured using heat or possibly light if the mould or part is translucent for the curing light, and the mould separated from the elastic material.

In the moulded elastic part, bump 204, which is moulded on top of the substrate 202 where the IC:s are to be placed, vias to contact metal connectors on the substrate 202 are etched using photolitographic masking and reactive ion, plasma, etching or using direct laser ablation. After this the elastic part is metallised, and the metal patterned using photolithographic methods or direct laser ablation. Chips are separated by cutting in the centre of the grooves using a saw blade that is thinner than the width of the grooves. Alternatively, the etched grooves may be used as nicks for controllably breaking the wafer.

The flip-chip 214 is placed facing down onto the elastic bump structure 204. The required pre-alignment is equal to the projected width of inclined frame walls 220, that could be in the range of some tenths of a millimetre. Full alignment would be achieved by gentle pressing or vibration combined with some force (gravity). After this the flip-chip 214 is to be pressed into the elastic bump structure 204 as it stays in place with the force 218. This is preferably done using a cooling plate having grease, oil or liquid metal as a thermal contact provider. The cooling plate is stiffly fastened to the substrate. Holding the flip-chip 214 onto the elastic bump structure 204 ensures a good electrical connection without solder fatigue and strain to the flip-chip 214. Should the flip-chip 214 be or become faulty, it is easily replaced by first removing the cooling plate, then removing the faulty chip, inserting a new one and remounting the cooling plate.

When contacting the chips the pads of the chip may be made of or covered with a non oxidising metal, preferably gold, to ensure good contacts. As the gold metallised elastic bumps are not able to penetrate surface oxide the metallised bumps do not in any way harm or modify the chip pads and this is of great advantage when used for testing.

Another possibility with the well-controlled dimensions of the V-groove etching of the silicon, is to obtain a tight seal around the IC, since both the facets of the flip-chip 214 and those of the guiding frame 212 are extremely flat surfaces.

The bumps 204, including the guiding frame 212, are processed on top of a multi-layer structure 216, which is electrically contacted through contact points at each bump 204. The processing of relatively thin layers of silicon elastomers to make vias to the multi-layer structure 216, can be made by standard lithography methods and reactive ion etching. Due to the small dimensions possible with this technique and to the availability of well-defined conductor and ground plane structures directly beneath each bump 204 very well impedance matched connections or much reduced inductance and capacitance connections usable up to very high frequencies (tenths of GHz) can be achieved.

Lithography to pattern metal layers 216 over areas with the bumps 204 requires special techniques if fine patterns are to be resolved on top of the bumps 204. The flip-chip 214 metallisation has to be finished by, most likely, a gold layer. Special metallisation is also required for all other reliable flip-chip and micro bumps schemes. Specifically, Ti/W+Au metallisations are well-established additions to Al metallisations in substantial use for TAB mounting.

The most precise alignment will be obtained when using inclined walls 220 of the guiding frame 212 and inclined walls 222 of the flip-chip 214. When making inclined walls of the flip-chip 214 an anisotropic etching is used on (100) surfaces on the Si wafer. The most perfect guiding frame and elastic bumps will be formed by using: an anisotropically etched (100) Si wafer and high precision lithography, a conformally covering release agent layer, and a curable silicone compound, as described in a simultaneously filed patent application "Method for making elastic bumps". To get the structure 200 aligned the substrate 202, i.e. the inclined frame walls 220 of the guiding frame 212 and the truncated bumps 204, and the flip-chip 214 has to be placed by some pre-alignment such that the inclined frame walls 220 are within the periphery of the inclined flip-chip walls 222. By cautiously applying pressure, force 218, e.g. gravity, to the flip-chip 214 the inclined flip-chip walls 222 will slide on the inclined frame walls 220 to get very precise alignment in the directions parallel to the base surface of the bump or the groove. By thus aligning the substrate 202 and the flip-chip 214 all the connection bumps 204 will mate the pad pattern 210 regardless of minute thickness differences or metal roughness due to micro crystallisation etc. Also, due to the elasticity, small differences in expansion between the parts could occur without loosing contact or exposing the parts to severe strain.

To make the inclined frame walls 220, a polished (100) silicon wafer, e.g. a mould is covered using SiN, then resist is deposited and patterned using a mask that is well aligned to the crystal directions. The SiN is then etched, after that the wafer is exposed to an anisotropic etchant that produces grooves limited by {111} planes limited by the mask. Evidently, for the alignment structures to work they must extend farther away from the substrate 202 than the connection bumps 204 as the aligning structures are to mate the inclined chip walls 222 whilst the connecting bumps 204 are to mate the pad pattern 210 of the chip 214.

A similar, but mirrored, mask without the connection bump grooves, which with very high precision replicates the first mask is then used to, by equivalent procedure, obtain similar but mirrored grooves in the scribing areas of the wafer that contains the IC:s that are to be used. These grooves must be as deep as or deeper than those on the mould wafer defining the alignment structures, or they must be as deep as to make the exposed {111} planes be terminated by the saw cut when dicing the IC:s.

The bumps are typically much smaller than the guiding frame, and their height difference can be achieved in one step utilising the property of the anisotropic etch to essentially stop when the (100) surfaces have been removed by the etch resulting in grooves, shaped as a pyramid. Thus, if the etch of the mould wafer is continued until complete, elongated, tetraedical grooves are formed and the depth of these grooves are determined by the size of the holes in the mask. This, however, will result in very sharply pointed connection bumps that may cause problems with metallisation and electrical contacting to the chip pads. One alternative is to first etch either the bump grooves or the alignment structure, i.e. the frame grooves to the desired depth, then to cover the wafer with another mask (SiN), define the holes not etched and etch the frame grooves or the grooves to the desired depth, respectively. By this alternative truncated pyramid grooves are formed giving less problem with metallisation and contacting.

The mould wafer may not at all have the same repetition distance as the IC wafer as this would be used to make flip-chip 214 sockets to be placed on boards or substrates. For MCM:s it would also be possible to make a mould wafer that contains relevant structures for all the chips that would be used in the MCM. Thus all these would be moulded on the MCM simultaneously.

The mould wafer is covered with some release agent that is deposited very thin and conformally by layer by layer growth from a solution or gas phase in order to preserve the precise geometry, see the simultaneously filed patent application "Method for making elastic bumps". For the part to be bumped, i.e. the board or the MCM, the most rational procedure is to first create the metal and dielectric layers as usual. Either the plate with the substrates or the mould wafer is then covered with a curable elastic compound to a controlled thickness using spinning, scraping or spraying. Then the mould wafer and the substrates are pressed together in a vacuum using some alignment procedure for alignment to the substrate structures, allowing the compound to wet the opposing surfaces. The alignment procedure could also be using some groove made on the mould wafer mating some structure on the substrate, or opto-mechanical means are used. For the MCM case this would imply fewer alignment operations as now one precise alignment is performed for all the chips instead of individual alignments. For the board case a few chips could use the same mould and a few moulds would be needed on the board. On the other hand, mould placement would be less critical on the board considering the feature sizes on the board.

The package is then removed from the vacuum and placed at elevated temperature to cure the compound. The mould wafer is then separated from the substrate 202. Using stiff mould wafers and substrates would require this to be done in a vacuum due to the hermetic fit of the compound to the mould. For special applications the substrate could be made of flexible material, which would facilitate separation. In the thin parts of the moulded material outside of the bumps 204, vias are formed to the metal lines, which are to be contacted very close to the bump. Metal is deposited and patterned. It suffices that the resist will cover the bumps 204 and the vias and that it can be patterned in the areas around the bumps and the vias. There is no need to pattern the resist on the bumps or in the vias.

The best cooling will be achieved using direct contact to the backside of the chip. Such coolers may not usually be attached only to the chip backside, but also to the surrounding substrate. Thus the total strain situation will be even more complex with the IC, cooler and substrate all having different thermal expansion coefficients An alternative embodiment of the previously described preferred embodiment could be realised but at some loss of precision. The bumps could have a different shape. In this case one would not use anisotropic etching but rather some other etching or machining. For this the grooves and the bumps do not have to have the same shape as long as the bump would fit in the groove in a self centring fashion and contacts were made. The compound could be other than Silicone, i.e. polyurethane or some other elastic or semi-elastic compound.

Figure 3:
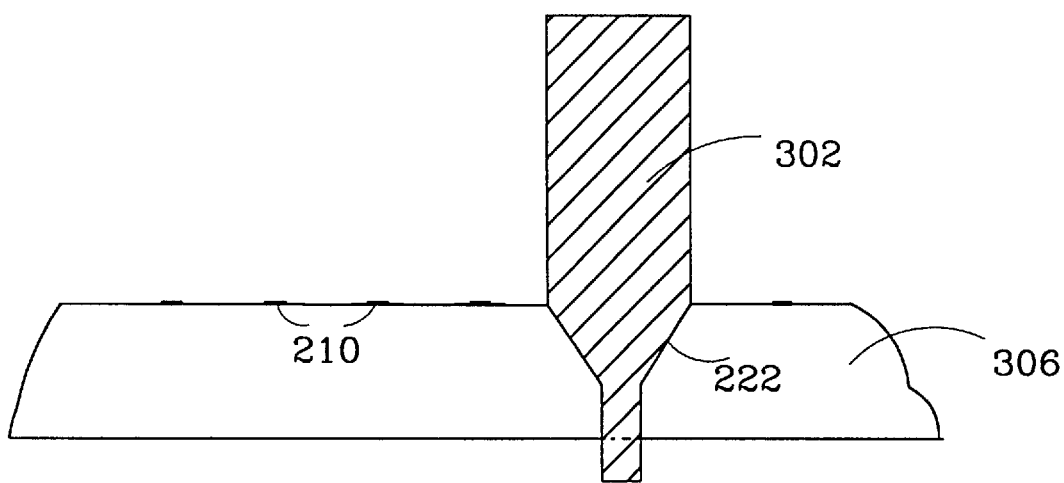
FIG. 3 shows a cross section of a modified saw blade cutting a cross section of a wafer.

By making a modified dicing saw, see FIG. 3 the inclined alignment walls 222 of the chips could be obtained directly by the sawing action rationalising the alignment groove fabrication of the wafers 306 and enabling other materials than (100) Si wafers. However, this will not yield the same precision as the anisotropically etched side walls.

FIG. 3 shows a modified saw blade 302, pads 210, a wafer 306 and inclined walls 222 directly defined by sawing.

Even without using a special saw a good alignment would be obtainable by making a mould having steeper alignment structures into which conventionally cut IC:s could be pressed down to mate the connecting bumps. This would in principle be directly applicable to conventional chips provided the pad metallisation is adequate.

By replicating using several steps, a flexible mould could be made easing the detachment of the mould from the substrate 202 but only at a loss of accuracy.

If elastic material could be "perfectly" conformally deposited on the inclined frame walls 220 a stiff bump could be used instead. One way to accomplish this would be to use a mould, which would fill part of the groove, but not completely, so as to leave a thin distance to the groove walls where the elastic compound would cure.

The basic idea with this invention is using rather gross alignment structures yet at high precision to align the flip-chip 214 versus the substrate 202, allowing for very relaxed demands on pre-lignment. Also, the pads 210 of the IC do not need to be modified, except that the pad metal must not be oxidising, which is the case for all micro bump, conducting, adhesive and flip-chip connections.

In principle the same objective can be met but at higher pre-lignment requirements by modifying the pads 210 on the IC to be indented so as to align to mate the bumps 204. This might imply a greater modification to the IC manufacturing, and the pre-lignment requirements are almost as high as if the alignment feature was not there.

If one could very precisely control the thickness and shape of deposited elastomers on the inclined frame walls 220 of the substrate 202, in principle the same features would be obtained by pressing the part down between rigid stops.

In order to get maximum precision, there must be means to cover the mould with releasing agents as very conformal and thin layers. Methods for this were described above and in the simultaneously filed patent application "Method for making elastic bumps". Also for this maximum precision case single crystals are needed with surfaces well aligned to the crystal directions which can be used for anisotropic etching. They are available as commercial Si-wafers. As mentioned, the IC:s have to have a final metallisation on the pads 210 to allow soft contacting. This is easily achieved after passivation, by metallising with Ti/W and finally Au, which is standard procedure for all bump-like IC connection solutions.

An alternative solution is to use steeply etched walls of the guiding frame 212 and cut edges of the flip-chip 214. In this case it would be possible to obtain an automatic chip attachment by pressing the chip into such a frame. However, the alignment precision will be significantly reduced in comparison with the previous described approach.

An intermediate alternative is to use a precision V-groove mould for the elastomer but to use the specially shaped saw blade 302, see FIG. 3, to make a tapered edge on the chip when dicing the wafer.

This invention has another significant implication. By the ease whith which the flip-chip 214 can be replaced, this chip mounting technology can also be used as a test jig scheme. This mounting technology offers testing at real environment conditions. Testing of individual chips can thus be performed in the actual system, in system-like conditions or by bringing the connections out from the chip on impedance controlled lines.

The invention described above may be embodied in yet other specific forms without departing from the spirit or essential characteristics thereof. Thus, the present embodiments are to be considered in all respects as illustrative and not restrictive, the scope of the invention being indicated by the appended claims rather than by the foregoing descriptions, and all changes, which come within the meaning and range of equivalency of the claims are therefore intended to be embraced therein.

What is claimed is:

1. An assembly structure comprising:
    at least a flip-chip and a substrate, the substrate having at least one elastic bump and the chip having at least one contact pad, the elastic bump having a pattern that corresponds to a pad pattern on the chip, the substrate having a frame of elastomeric material, and the chip having an edge, the frame of elastomeric material defining a portion having the same shape as the edge of the chip.

2. An assembly structure according to claim 1, wherein the frame is square or rectangular with four edges.

3. An assembly structure according to claim 2, wherein frame has two or more inclined frame walls.

4. An assembly structure according to claim 1, wherein the frame has at least one inclined frame wall, the flip-chip has at least one inclined chip wall, and the inclined frame wall and inclined chip wall have the same shape and inclination.

5. An assembly structure according to claim 4, wherein the frame is square or rectangular with four edges.

6. An assembly structure according to claim 5, wherein the frame has two or more inclined frame walls.

7. An assembly structure according to claim 1, wherein at least one of the pads and at least one of the elastic bumps include gold contacts.

8. An assembly structure according to claim 1, further comprising at least one press device for pressing the flip-chip and the substrate together.

9. An assembly structure according to claim 8, wherein the press device includes a plate.

10. An assembly structure according to claim 9, wherein the plate is provided for cooling the chip.

11. An assembly structure, comprising:
a substrate having an elastomeric frame having at least one elastic bump, said substrate having a contact pad located at said elastic bump; and
a chip having a contact pad, said elastomeric frame and said chip having a plurality of complementary-shaped surfaces, said contact pad of said substrate and said contact pad of said chip contacting each other when said complimentary-shaped surfaces are aligned against each other.

12. The assembly structure of claim 11, wherein said elastomeric frame defines a recess for receiving said chip, said recess having an interior surface having said elastic bump, said recess having an inclined surface that is obliquely inclined with respect to said interior surface, said chip having an inclined surface, said inclined surface of said chip and said inclined surface of said elastomeric frame defining at least a portion of said complementary-shaped surfaces.

13. The assembly structure of claim 11, wherein said chip includes a plurality of contact pads arranged in a pad pattern, said elastomeric frame having a plurality of elastic bumps arranged in a pattern that corresponds to said pad pattern.

14. The assembly structure of claim 11, wherein said chip has an edge portion that defines said complementary-shaped surfaces of said chip.

15. The assembly structure of claim 11, further comprising means for forcing said complementary-shaped surfaces against each other.

16. The assembly structure of claim 15, wherein said means for forcing said complementary-shaped surfaces against each other includes a plate for cooling said chip.

17. The assembly structure of claim 11, wherein said elastomeric frame includes a plurality of elastic bumps each having a contact pad, said contact pads of said plurality of elastic bumps substantially lying in a common plane, said complementary-shaped surfaces of said frame including a planar surface that is obliquely angled with respect to said common plane.

18. The assembly structure of claim 11, wherein said complimentary-shaped surfaces abut each other and are angled with respect to a side surface of said chip.

19. The assembly structure of claim 11, wherein the chip is a flip-chip.

20. An assembly structure, comprising:
a substrate having an elastomeric frame having a plurality of elastic bumps that each extend away from a first surface of said frame, each of said bumps having a contact pad and being arranged in a bump pattern, said elastomeric frame also having a second surface that is inclined with respect to said first surface; and
a chip having a plurality of contact pads, said chip having a portion possessing a surface with a same shape as said second surface of said elastomeric frame, said contact pads of said elastomeric frame being arranged in a pad pattern, said bump pattern corresponding to said pad pattern.

21. The assembly structure of claim 20, wherein said second surface of said elastomeric frame defines an oblique angle with respect to said first surface and also defines at least a portion of a recess that receives said chip.

22. The assembly structure of claim 21, wherein said second surface of said frame abuts against said surface of said chip.

23. The assembly structure of claim 20, wherein said surface of said chip is obliquely inclined with respect to a side surface of said chip.

24. The assembly structure of claim 20, wherein said contact pads of said chip abut against said contact pads of said elastic bumps when said surface of said chip is aligned against said second surface of said elastomeric frame.

25. The assembly structure of claim 20, wherein the chip is a flip-chip.

26. A substrate for receiving a chip, comprising:
a frame of elastomeric material that includes a plurality of elastic bumps arranged in a pattern that corresponds to a contact pad pattern of the chip, said frame of elastomeric material also including at least two elastic surfaces for engaging at least two surfaces of the chip, said at least two surfaces of said frame of elastomeric material being similarly shaped as the at least two surfaces of the chip, each of said elastic bumps including a contact pad for contacting a respective contact pad of the chip when said at least two surfaces of said frame engage the at least two surfaces of the chip.

27. The substrate of claim 26, further comprising the chip and a device for pressing the chip toward said substrate so as to maintain contact between said contact pads of said chip and said contact pads of said substrate without a solder or glue connection.

* * * * *